(12) United States Patent
Takizawa et al.

(10) Patent No.: US 12,543,582 B2
(45) Date of Patent: Feb. 3, 2026

(54) WIRING BOARD

(71) Applicant: SHINKO ELECTRIC INDUSTRIES CO., LTD., Nagano (JP)

(72) Inventors: Masaya Takizawa, Nagano (JP); Yuki Kobayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 173 days.

(21) Appl. No.: 18/418,655

(22) Filed: Jan. 22, 2024

(65) Prior Publication Data

US 2024/0266273 A1   Aug. 8, 2024

(30) Foreign Application Priority Data

Feb. 8, 2023   (JP) .................. 2023-017658

(51) Int. Cl.
*H01L 21/48*   (2006.01)
*H01L 23/00*   (2006.01)
*H01L 23/498*   (2006.01)

(52) U.S. Cl.
CPC .... *H01L 23/49838* (2013.01); *H01L 21/4846* (2013.01); *H01L 23/49827* (2013.01); *H01L 24/13* (2013.01); *H01L 24/16* (2013.01); *H01L 2224/13111* (2013.01); *H01L 2224/13116* (2013.01); *H01L 2224/13139* (2013.01); *H01L 2224/13147* (2013.01); *H01L 2224/16227* (2013.01)

(58) Field of Classification Search
CPC .............. H01L 21/4846; H01L 21/48; H01L 2224/13111; H01L 2224/13116; H01L 2224/13139; H01L 2224/13147; H01L 2224/16227; H01L 23/49827; H01L 23/49838; H01L 23/00; H01L 23/498; H01L 24/13; H01L 24/16
USPC .......................................... 174/264
See application file for complete search history.

(56) References Cited

U.S. PATENT DOCUMENTS

| | | | |
|---|---|---|---|
| 2004/0256238 A1* | 12/2004 | Suzuki ............... | H01L 21/2885 257/E21.585 |
| 2019/0103310 A1* | 4/2019 | Liang .................. | H01L 21/7685 |
| 2021/0202361 A1* | 7/2021 | Shimizu ............... | H05K 3/4673 |
| 2021/0384120 A1* | 12/2021 | Liu ..................... | H01L 25/0655 |

FOREIGN PATENT DOCUMENTS

JP   2005-332927   12/2005

* cited by examiner

*Primary Examiner* — Timothy J Thompson
*Assistant Examiner* — Guillermo J Egoavil
(74) *Attorney, Agent, or Firm* — IPUSA, PLLC

(57) ABSTRACT

A wiring board includes an insulating layer covering upper and side surfaces of a first interconnect layer, a via hole penetrating the insulating layer and reaching the first interconnect layer, a second interconnect layer filling the via hole and extending on the insulating layer, and a cavity provided in the first interconnect layer, communicating with the via hole and extending outside than a lower end of an inner side surface of the via hole in a plan view. The second interconnect layer includes a first seed layer provided on the insulating layer, a second seed layer continuously covering upper and inner side surfaces of the first seed layer, the inner side surface of the via hole, and surfaces of the insulating layer and the first interconnect layer exposed inside the cavity, and an electrolytic plating layer provided on the second seed layer thicker than the first seed layer.

10 Claims, 7 Drawing Sheets

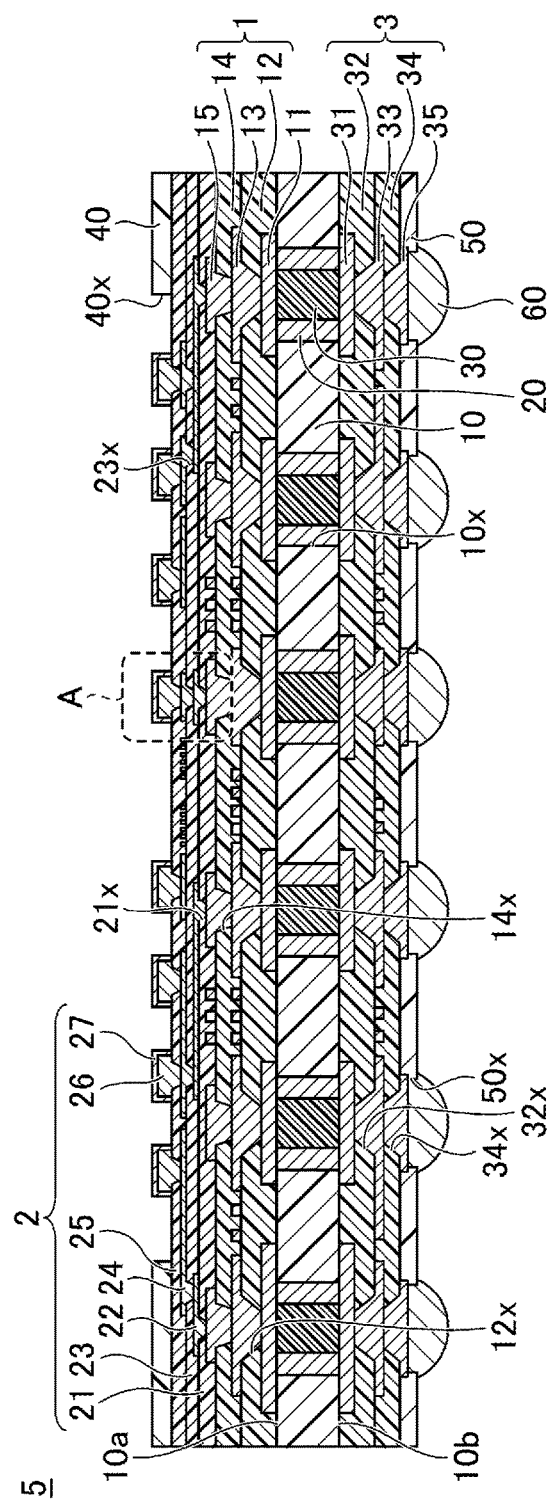
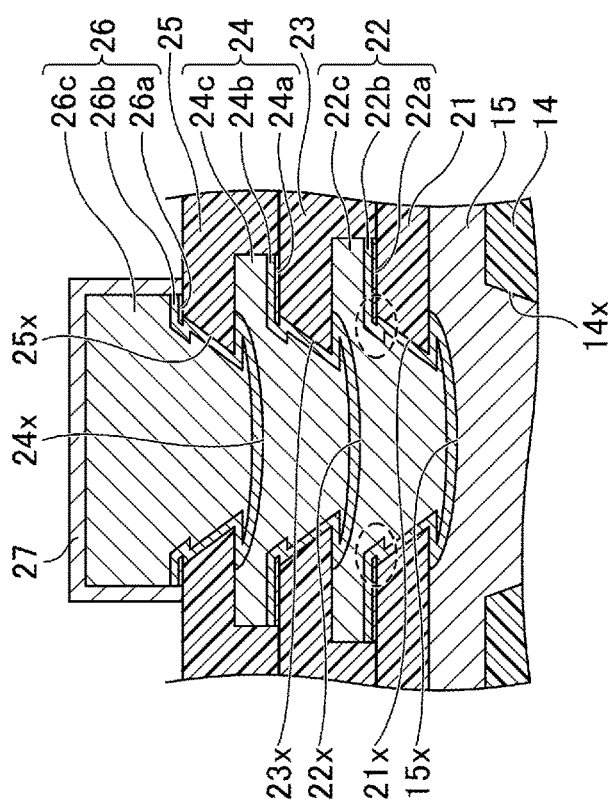
FIG.1A
FIG.1B

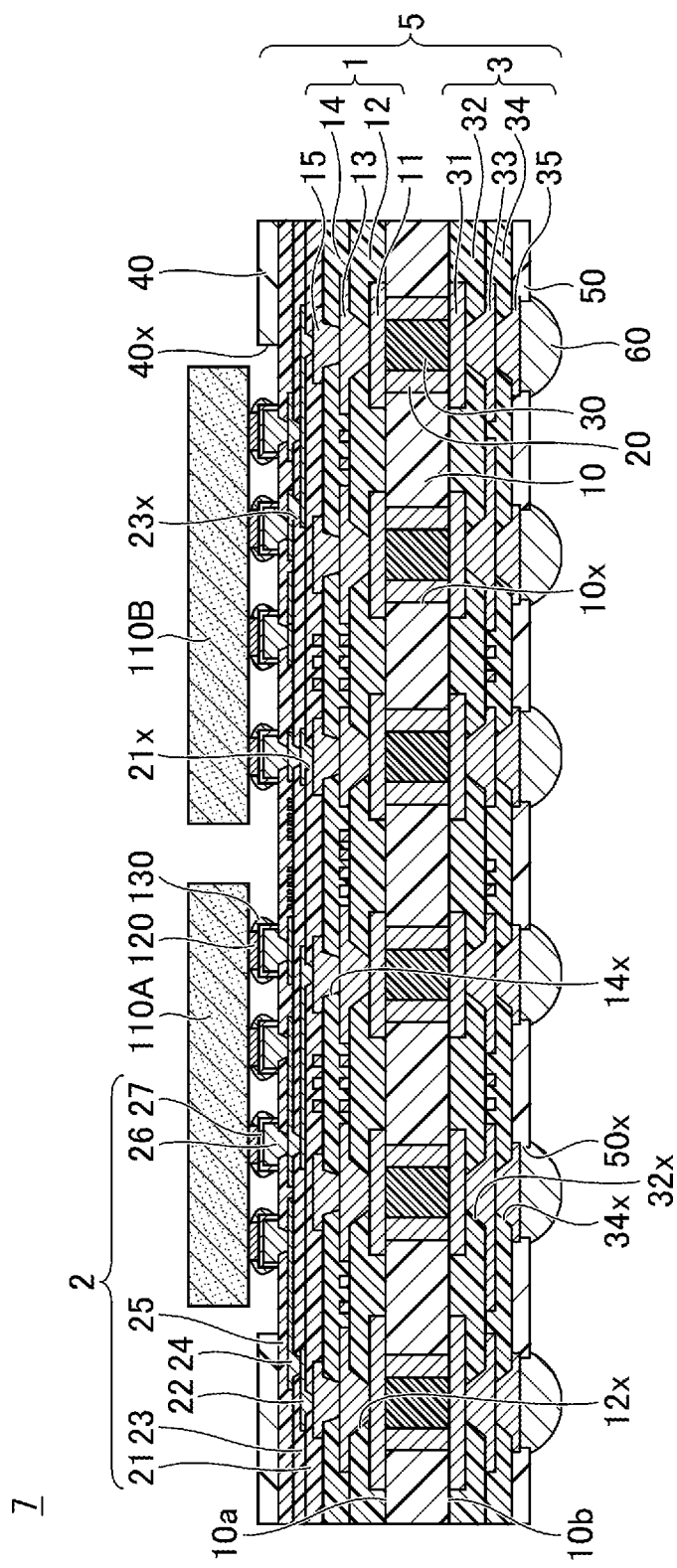

WIRING BOARD

CROSS-REFERENCE TO RELATED APPLICATIONS

This application is based upon and claims priority to Japanese Patent Application No. 2023-017658, filed on Feb. 8, 2023, the entire contents of which are incorporated herein by reference.

FIELD

Certain aspects of the embodiments discussed herein are related to wiring boards, and methods for manufacturing wiring boards.

BACKGROUND

Conventionally, there is a known wiring board having insulating layers and interconnect layers that are alternately laminated. In such a wiring board, a via hole is formed in the insulating layer, a seed layer is formed inside the via hole and on an upper surface of the insulating layer, and electrolytic plating is performed by using the seed layer as a power supply layer, for example, thereby forming the interconnect layer. The seed layer is formed inside the via hole and on the upper surface of the insulating layer by a dry process, such as ion plating or the like, for example. Such a wiring board is proposed in Japanese Laid-Open Patent Publication No. 2005-332927, for example.

However, it is difficult to form the seed layer inside the via hole by the dry process. In recent years, in the wiring board for use in high-speed data transmission or the like, a size of the interconnect and a diameter of the via hole have decreased. But as the diameter of the via hole decreases, the tendency of the seed layer not deposited inside the via hole becomes more conspicuous.

Although it is conceivable to avoid such a problem by forming the seed layer by the wet process, when forming the seed layer by the wet process, the upper surface of the insulating layer and the inside of the via hole are generally roughened by a pretreatment in order to improve the adhesion of the seed layer. The surface roughness of the upper surface of the insulating layer increased due to the roughening may cause a significant skin effect, and may deteriorate high-frequency transmission characteristics of the wiring board.

SUMMARY

Accordingly, it is an object in one aspect of the embodiments to provide a wiring board which does not prevent a seed layer from being deposited inside the via hole, and prevents a surface roughness of an upper surface of an insulating layer from increasing.

According to one aspect of the embodiments, a wiring board includes a first interconnect layer; an insulating layer covering an upper surface and a side surface of the first interconnect layer; a via hole penetrating the insulating layer and reaching an upper surface of the first interconnect layer; a second interconnect layer filling the via hole and extending on an upper surface of the insulating layer; and a cavity provided in the first interconnect layer, recessed from the upper surface toward a lower surface of the first interconnect layer and communicating with the via hole, and extending to an outer peripheral side than a lower end of an inner side surface of the via hole in a plan view, wherein the second interconnect layer includes a first seed layer provided on the upper surface of the insulating layer; a second seed layer continuously covering an upper surface and an inner side surface of the first seed layer, the inner side surface of the via hole, a surface of the insulating layer exposed inside the cavity, and a surface of the first interconnect layer exposed inside the cavity; and an electrolytic plating layer provided on the second seed layer, and the first seed layer is thinner than the second seed layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

FIG. 1A and FIG. 1B are cross sectional views illustrating an example of a wiring board according to a first embodiment;

FIG. 7 is a cross sectional view illustrating an example of a semiconductor device according to an application example of the first embodiment.

DESCRIPTION OF EMBODIMENTS

Figure 2A:
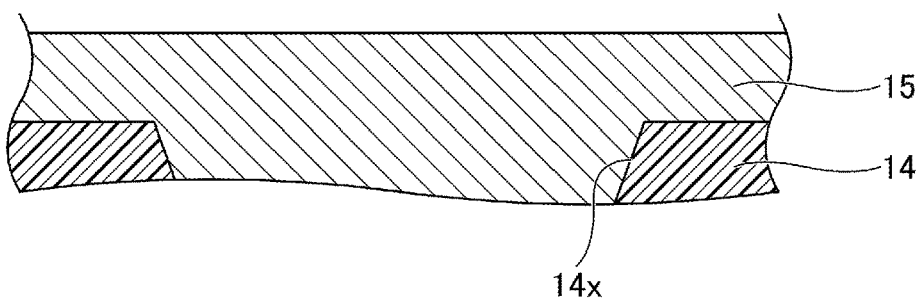
FIG. 2A, FIG. 2B, and FIG. 2C are diagrams (part 1) illustrating examples of manufacturing processes of the wiring board according to the first embodiment.

Preferred embodiments of the present invention will be described with reference to the accompanying drawings. In the drawings, those parts that are the same are designated by the same reference numerals, and a repeated description of the same parts may be omitted.

First Embodiment

Structure of Wiring Board

FIG. 1A and FIG. 1B are cross sectional views illustrating an example of a wiring board according to a first embodiment. FIG. 1A is an overall view of the wiring board, and FIG. 1B is an enlarged view of a region A illustrated in FIG. 1A.

As illustrated in FIG. 1A and FIG. 1B, a wiring board 5 includes a core layer (or core substrate) 10, a first interconnect structure 1, a second interconnect structure 2, a third interconnect structure 3, solder resist layers 40 and 50, and external connection terminals 60. The first interconnect structure 1 and the second interconnect structure 2 are disposed on one side of the core layer 10, and the third interconnect structure 3 is disposed on the other side of the core layer 10. The solder resist layers 40 and 50 and the external connection terminals 60 may be provided, as required.

In the present embodiment, for the sake of convenience, the side of the wiring board 5 provided with the solder resist layer 40 in FIG. 1A and FIG. 1B is referred to as an upper side or one side, and the side of the wiring board 5 provided with the solder resist layer 50 in FIG. 1A and FIG. 1B is referred to as a lower side or the other side. The surface of each portion on the side of the wiring board 5 provided with the solder resist layer 40 is referred to as one surface or an upper surface, and the surface of each portion on the side of the wiring board 5 provided with the solder resist layer 50 is referred to as the other surface or a lower surface. However, the wiring board 5 can be used in an upside-down state or can be arranged at an arbitrary angle. Further, a plan view of an object refers to a view of the object viewed from above in a normal direction to the one surface of the solder resist layer 40, and a planar shape of the object indicates a shape of the object in the plan view viewed from above in the normal direction to the one surface of the solder resist layer 40.

The core layer 10 may be a so-called glass epoxy substrate or the like having a glass cloth impregnated with a thermosetting insulating resin, such as an epoxy-based resin or the like, for example. The core layer 10 may be a substrate or the like having a woven or nonwoven fabric of glass fiber, carbon fiber, aramid fiber, or the like impregnated with a thermosetting insulating resin, such as an epoxy-based resin or the like. A thickness of the core layer 10 may be in a range of approximately 80 μm to approximately 1200 μm, for example. In each of the drawings, the illustration of the glass cloth or the like is omitted.

A plurality of via holes 10x penetrating the core layer 10 are formed in the core layer 10. The planar shape of the via hole 10x may be a circular shape having a diameter in a range of approximately 50 μm to approximately 100 μm, for example. A pitch of the via holes 10x may be in a range of approximately 100 μm to approximately 1000 μm, for example. Via electrodes 20 are formed on inner side surfaces of the via holes 10x, and central portions of the via holes 10x (the inner sides of the via electrodes 20) are filled with a resin 30. A material used for the via electrodes 20 may be copper (Cu) or the like, for example. A material used for the resin 30 may be a thermosetting insulating resin, such as an epoxy-based resin or the like, for example.

The first interconnect structure 1 is laminated on one surface 10a of the core layer 10. The first interconnect structure 1 includes a laminate of interconnect layers and insulating layers. In the first interconnect structure 1, the number of interconnect layers and the number of insulating layers are not limited to those of the present embodiment. The third interconnect structure 3 is laminated on the other surface 10b of the core layer 10. The third interconnect structure 3 includes a laminate of interconnect layers and insulating layers. In the third interconnect structure 3, the number of interconnect layers and the number of insulating layers are not limited to those of the present embodiment.

The interconnect layer 11 is an interconnect pattern formed on the one surface 10a of the core layer 10. The interconnect layer 31 is an interconnect pattern formed on the other surface 10b of the core layer 10. In the present specification, the interconnect pattern includes pads for receiving vias, and pads for external connection. The interconnect layer 11 is electrically connected to the interconnect layer 31 through the via electrodes 20 that penetrate the core layer 10. The interconnect layer 11 and the interconnect layer 31 are formed of a metal foil, such as a copper foil or the like, or a plating layer, such as a copper plating layer, for example. A thickness of each of the interconnect layer 11 and the interconnect layer 31 may be in a range of approximately 15 μm to approximately 35 μm, for example. A line-and-space (line/space, or L/S) of each of the interconnect layer 11 and the interconnect layer 31 may be in a range of approximately 10 μm/10 μm to approximately 50 μm/50 μm, for example.

In the line-and-space, the line represents an interconnect width, and the space represents an interval between adjacent interconnects (interconnect spacing). In a case where the line-and-space is in a range of 10 μm/10 μm to 50 μm/50 μm, for example, the interconnect width is in a range greater than or equal to 10 μm and less than or equal to 50 μm, and the interconnect spacing between the adjacent interconnects is in a range greater than or equal to 10 μm and less than or equal to 50 μm. The interconnect width and the interconnect spacing does not necessarily have to be the same.

The insulating layer 12 is formed on the one surface 10a of the core layer 10, so as to cover the interconnect layer 11. The insulating layer 32 is formed on the other surface 10b of the core layer 10, so as to cover the interconnect layer 31. Each of the insulating layer 12 and the insulating layer 32 is an insulating layer including a non-photosensitive resin as a main component thereof. Each of the insulating layer 12 and the insulating layer 32 may include a thermosetting non-photosensitive resin, such as an epoxy-based resin, an imide-based resin, a phenol-based resin, a cyanate-based resin, or the like as a main component thereof, for example. A thickness of each of the insulating layer 12 and the insulating layer 32 may be in a range of approximately 20 μm to approximately 40 μm, for example. Each of the insulating layer 12 and the insulating layer 32 may include a filler, such as silica ($SiO_2$) or the like.

The interconnect layer 13 is formed on one side of the insulating layer 12, and is electrically connected to the interconnect layer 11. The interconnect layer 13 includes via interconnects filling insides of via holes 12x that penetrate the insulating layer 12 and expose one surface of the interconnect layer 11, and an interconnect pattern formed on one surface of the insulating layer 12. The via hole 12x may be a cavity having an inverted truncated cone shape, and a diameter of a first opening of the cavity at one end which opens toward the insulating layer 14 is greater than a diameter of a second opening of the cavity at the other end, at a bottom surface of the cavity, formed by the upper surface of the interconnect layer 11.

The interconnect layer 33 is formed on the other side of the insulating layer 32, and is electrically connected to the interconnect layer 31. The interconnect layer 33 includes via interconnects filling insides of via holes 32x that penetrate the insulating layer 32 and expose the other surface of the interconnect layer 31, and an interconnect pattern formed on the other surface of the insulating layer 32. The via hole 32x may be a cavity having a truncated cone shape, and a diameter of a first opening of the cavity at one end which opens toward the insulating layer 34 is greater than a diameter of a second opening of the cavity at the other end, at a bottom surface of the cavity, formed by the lower surface of the interconnect layer 31.

A diameter of the first opening of each of the via holes 12x and 32x may be in a range of approximately 50 μm to approximately 60 μm, for example. A material used for each of the interconnect layer 13 and the interconnect layer 33 may be copper or the like, for example. A thickness of the interconnect pattern of each of the interconnect layer 13 and the interconnect layer 33 may be in a range of approximately 15 μm to approximately 25 μm, for example. The line-and-space of the interconnect pattern of each of the interconnect layer 13 and the interconnect layer 33 may be in a range of approximately 10 μm/10 μm to approximately 50 μm/50 μm, for example.

The insulating layer 14 is formed on the one surface of the insulating layer 12, so as to cover the interconnect layer 13. The insulating layer 34 is formed on the other surface of the insulating layer 32, so as to cover the interconnect layer 33. A material used for each of the insulating layer 14 and the insulating layer 34, and a thickness of each of the insulating layer 14 and the insulating layer 14 may be the same as those of the insulating layer 12 and the insulating layer 32, for example, respectively. Each of the insulating layer 14 and the insulating layer 34 may include a filler, such as silica ($SiO_2$) or the like.

The interconnect layer 15 is formed on one side of the insulating layer 14, and is electrically connected to the interconnect layer 13. The interconnect layer 15 includes via interconnects filling insides of via holes 14x that penetrate the insulating layer 14 and expose one surface of the interconnect layer 13, and an interconnect pattern formed on the one surface of the insulating layer 14. The via hole 14x may be a cavity having an inverted truncated cone shape, and a diameter of a first opening of the cavity at one end which opens toward the insulating layer 21 is greater than a diameter of a second opening of the cavity at the other end, at a bottom surface of the cavity, formed by the upper surface of the interconnect layer 13.

The interconnect layer 35 is formed on the other side of the insulating layer 34, and is electrically connected to the interconnect layer 33. The interconnect layer 35 includes via interconnects filling insides of via holes 34x that penetrate the insulating layer 34 and expose the other surface of the interconnect layer 33, and an interconnect pattern formed on the other surface of the insulating layer 34. The via hole 34x may be a cavity having a truncated cone shape, and a diameter of a first opening of the cavity at one end which opens toward the solder resist layer 50 is greater than a diameter of a second opening of the cavity at the other end, at a bottom surface of the cavity, formed by the lower surface of the interconnect layer 33.

A diameter of the first opening of each of the via holes 14x and 34x may be in a range of approximately 50 μm to approximately 60 μm, for example. A material used for each of the interconnect layer 15 and the interconnect layer 35, a thickness of the interconnect pattern of each of the interconnect layer 15 and the interconnect layer 35, and a line-and-space of the interconnect pattern of each of the interconnect layer 15 and the interconnect layer 35 may be the same as those of the interconnect layer 13 and the interconnect layer 33, for example, respectively.

The second interconnect structure 2 is disposed on the first interconnect structure 1. The second interconnect structure 2 includes a laminate of interconnect layers and insulating layers. In the second interconnect structure 2, the number of interconnect layers and the number of insulating layers are not limited to those of the present embodiment.

The interconnect width and the interconnect interval of the interconnect layers forming the second interconnect structure 2 are smaller than the interconnect width and the interconnect interval of the interconnect layers forming the first interconnect structure 1, respectively. The interconnect width and the interconnect interval of the interconnect layers forming the second interconnect structure 2 are smaller than the interconnect width and the interconnect interval of the interconnect layers forming the third interconnect structure 3, respectively. That is, the interconnect layers forming the second interconnect structure 2 are micro interconnect layers having an interconnect density higher than interconnect densities of the interconnect layers forming the first interconnect structure 1 and the interconnect layers forming the third interconnect structure 3.

The insulating layer 21 is provided on one surface of the insulating layer 14, and covers an upper surface and a side surface of the interconnect layer 15. The insulating layer 21 is an insulating layer including a non-photosensitive resin as a main component thereof. The insulating layer 21 may include a thermosetting non-photosensitive resin, such as an epoxy-based resin, an imide-based resin, a phenol-based resin, a cyanate-based resin, or the like as a main component thereof, for example. The insulating layer 21 may include a filler, such as silica ($SiO_2$) or the like. The insulating layer 21 is thinner than the insulating layers 12 and 14. A thickness of the insulating layer 21 may be in a range of approximately 10 μm to approximately 20 μm, for example. The insulating layer 21 is provided with via holes 21x that penetrate the insulating layer 21 and reach the upper surface of the interconnect layer 15.

The interconnect layer 22 is formed on one side of the insulating layer 21, and is electrically connected to the interconnect layer 15 of the first interconnect structure 1. The interconnect layer 22 fills the via holes 21x, and extends to an upper surface of the insulating layer 21. Portions of the interconnect layer 22 filling the via holes 21x form via interconnects, and portions of the interconnect layer 22 extending on the upper surface of the insulating layer 21 form interconnect patterns. A material used for the interconnect layer 22 may mainly include copper or the like, for example. A thickness of the interconnect patterns forming the interconnect layer 22 may be in a range of approximately 5 μm to approximately 10 μm, for example. A line-and-space of the interconnect patterns forming the interconnect layer 22 may be in a range of approximately 3 μm/3 μm to approximately 8 μm/8 μm, for example.

The insulating layer 23 is provided on one surface of the insulating layer 21, and covers the upper surface and a side surface of the interconnect layer 22. A material used for the insulating layer 23 and a thickness of the insulating layer 23 may be the same as those of the insulating layer 21, for example. The insulating layer 23 may include a filler, such as silica ($SiO_2$) or the like. The insulating layer 23 is provided with via holes 23x that penetrate the insulating layer 23 and reach the upper surface of the interconnect layer 22.

The interconnect layer 24 is formed on one side of the insulating layer 23, and is electrically connected to the interconnect layer 22. The interconnect layer 24 fills the via holes 23x, and extends to an upper surface of the insulating layer 23. Portions of the interconnect layer 24 filling the via holes 23x form via interconnects, and portions of the interconnect layer 24 extending on the upper surface of the insulating layer 23 form interconnect patterns. A material used for the interconnect layer 24, a thickness of the interconnect patterns of the interconnect layer 24, and a line-and-space of the interconnect patterns of the interconnect layer 24 may be the same as those of the interconnect layer 22, for example.

The insulating layer 25 is provided on one surface of the insulating layer 23, and covers an upper surface and a side surface of the interconnect layer 24. A material used for the insulating layer 25 and a thickness of the insulating layer 25 may be the same as those of the insulating layer 23, for example. The insulating layer 25 may include a filler, such as silica ($SiO_2$) or the like. The insulating layer 25 is provided with via holes 25x that penetrate the insulating layer 25 and reach the upper surface of the interconnect layer 24.

The interconnect layer 26 is formed on one side of the insulating layer 25, and is electrically connected to the interconnect layer 24. The interconnect layer 26 fills the via holes 25x, and extends to an upper surface of the insulating layer 25. Portions of the interconnect layer 26 filling the via holes 25x form via interconnects, and portions of the interconnect layer 26 extending on the upper surface of the insulating layer 25 form electrodes.

A material used for the interconnect layer 26 may be the same as that of the interconnect layer 22, for example. A thickness of the electrodes forming the interconnect layer 26 may be in a range of approximately 10 μm to approximately 20 μm, for example. The planar shape of the electrodes forming the interconnect layer 26 may be a circular shape having a diameter in a range of approximately 20 μm to approximately 30 μm, for example. A pitch of the electrodes forming the interconnect layer 26 may be in a range of approximately 40 μm to approximately 50 μm, for example. The interconnect layer 26 can be used for making electrical connection with an electronic component, such as a semiconductor chip or the like.

The metal layer 27 covers an upper surface and a side surface of the electrodes forming the interconnect layer 26. The metal layer 27 is provided, as required. The metal layer 27 may be formed of a single layer, or may be formed of a laminated structure having a plurality of layers. Examples of the metal layer 27 include a Au layer, a Ni/Au layer (a metal layer in which a Ni layer and a Au layer are laminated in this order), and a Ni/Pd/Au layer (a metal layer in which a Ni layer, a Pd layer, and a Au layer are laminated in this order), or the like. In the metal layer 27, a thickness of the Ni layer may be in a range of approximately 1 μm to approximately 10 μm, for example. A thickness of the Pd layer may be in a range of approximately 0.01 μm to approximately 0.5 μm, for example. A thickness of the Au layer may be in a range of approximately 0.01 μm to approximately 0.5 μm, for example.

The solder resist layer 40 is an outermost insulating layer formed on the outer peripheral side of one surface of the insulating layer 25 of the second interconnect structure 2. A material used for the solder resist layer 40 may be a photosensitive insulating resin including a phenol-based resin, a polyimide-based resin, or the like as a main component thereof, for example. The solder resist layer 40 may include a filler, such as silica ($SiO_2$) or the like. The solder resist layer 40 has openings 40x, and the electrodes of the interconnect layer 26 are exposed inside the openings 40x, respectively.

The solder resist layer 50 is an outermost insulating layer formed on the other surface of the insulating layer 34 of the third interconnect structure 3, so as to cover the interconnect layer 35 of the third interconnect structure 3. A material used for the solder resist layer 50 may be a photosensitive insulating resin including a phenol-based resin, a polyimide-based resin, or the like as a main component thereof, for example. The solder resist layer 50 may include a filler, such as silica ($SiO_2$) or the like.

The solder resist layer 50 has openings 50x, and portions of the interconnect layer 35 of the third interconnect structure 3 are exposed at bottoms of the openings 50x, respectively. The external connection terminals 60, such as solder balls or the like, are formed on the interconnect layer 35 exposed inside the openings 50x, as required.

Next, a structure of the region A will be described in more detail, mainly with reference to FIG. 1B.

The interconnect layer 15 is provided with cavities 15x that are recessed from the upper surface toward the lower surface of the interconnect layer 15, communicate with the via holes 21x, and extend to the outer peripheral side than the lower end of the inner side surface of the via holes 21x in the plan view. A depth of a deepest portion of the cavity 15x may be in greater than or equal to approximately 1 μm and less than or equal to approximately 5 μm, for example. A length of a portion of the cavity 15x extending toward the outer peripheral side from the lower end of the inner surface of the via hole 21x in the plan view may be greater than or equal to approximately 1 μm and less than or equal to approximately 20 μm, for example.

A part or all of the insulating layer 21 forming the inner side surface of the via holes 21x in the plan view overlaps the outer peripheral portion of the cavities 15x. The insulating layer 21 does not enter inside the cavities 15x. The cavity 15x has a shape such that a central side thereof is the deepest, and the depth decreases toward the outer peripheral side, for example.

The via hole 21x may be a cavity having an inverted truncated cone shape in the cross sectional view, and a maximum width of a first opening of the cavity at one end which opens toward the insulating layer 23 is greater than a maximum width of a second opening of the cavity at the other end reaching the upper surface of the interconnect layer 15. The maximum width of the first opening of cavity forming the via hole 21x may be greater than or equal to approximately 5 μm and less than or equal to approximately 15 μm, for example. The maximum width of the second opening of the cavity forming the via hole 21x may be greater than or equal to approximately 2 μm and less than or equal to approximately 12 μm, for example. The depth of the via hole 21x may be greater than or equal to approximately 5 μm and less than or equal to approximately 20 μm, for example. An aspect ratio of the via hole 21x, defined as (the depth of the via hole 21x)/(the maximum width of the first opening of the cavity forming the via hole 21x), may be greater than or equal to 0.25 and less than or equal to 4, for example. The maximum width is defined as a length of a longest straight line that can be continuously drawn between two points on an outer edge of the first opening or the second opening of the cavity forming the via hole 21x in the plan view. The maximum width of the via hole 21x is the diameter in a case where the first opening or the second opening of the cavity forming the via hole 21x has a circular shape in the plan view, the major axis in a case where the first opening or the second opening of the cavity forming the via hole 21x has an elliptical shape in the plan view, and the diagonal length in a case where the first opening or the second opening of the cavity forming the via hole 21xhas a rectangular shape or a square shape in the plan view.

A surface roughness of the upper surface of the insulating layer 21 is smaller than a surface roughness of the inner side surface of the via hole 21x. The surface roughness of the upper surface of the insulating layer 21 is preferably Ra30 nm or less, where Ra denotes the arithmetic mean roughness. The surface roughness of the upper surface of the insulating layer 21 is more preferably Ra20 nm or less, and still more preferably Ra10 nm or less. The surface roughness of the inner side surface of the via hole 21x may be in a range greater than or equal to Ra100 nm and less than or equal to Ra200 nm, for example.

The interconnect layer 22 includes a first seed layer 22a, a second seed layer 22b, and an electrolytic plating layer 22c. The first seed layer 22a is provided on the upper surface of the insulating layer 21. The first seed layer 22a is preferably formed of a material having good adhesion with respect to the insulating layer 21. For example, in a case where the insulating layer 21 is formed of an epoxy-based resin, examples of a material used for the first seed layer 22a include metals, such as titanium (Ti), aluminum (Al), chromium (Cr), or the like, and alloys, such as CuNi, CuNiTi, or the like. The first seed layer 22a can be formed by a dry process.

The second seed layer 22b continuously covers an upper surface and an inner side surface of the first seed layer 22a, the inner side surface of the via holes 21x, the surface of the insulating layer 21 exposed inside the cavities 15x, and the surface of the interconnect layer 15 exposed inside the cavities 15x. A material used for the second seed layer 22b may be copper (Cu), for example. The second seed layer 22b can be formed by a wet process. The first seed layer 22a is thinner than the second seed layer 22b. A thickness of the first seed layer 22a may be greater than or equal to 10 nm and less than or equal to 100 nm, for example. A thickness of the second seed layer 22b may be greater than or equal to 100 nm and less than or equal to 1000 nm, for example.

The electrolytic plating layer 22c is provided on the second seed layer 22b inside the cavities 15x, inside the via holes 21x, and above the insulating layer 21. A portion of the electrolytic plating layer 22c located inside the cavities 15x may include portions opposing the lower surface of the insulating layer 21 through the second seed layer 22b. A material used for the electrolytic plating layer 22c may be copper, for example.

The first seed layer 22a may include a protruding portion that protrudes toward an inner peripheral side than an upper end of the inner side surface of the via hole 21x in the plan view. FIG. 1B illustrates an example in which the first seed layer 22a includes the protruding portion, and the protruding portion of the first seed layer 22a is present inside an ellipse indicated by a broken line. The protruding portion of the first seed layer 22a is provided in an annular shape in the plan view, for example. A length of the protruding portion of the first seed layer 22a protruding toward the inner peripheral side than the upper end of the inner side surface of the via hole 21x in the plan view may be greater than or equal to 0.5 μm and less than or equal to 3 μm, for example.

In a case where the first seed layer 22a includes the protruding portion, the second seed layer 22b continuously covers the upper surface and the inner side surface of the first seed layer 22a, a lower surface of the protruding portion of the first seed layer 22a, the inner side surface of the via holes 21x, the surface of the insulating layer 21 exposed inside the cavities 15x, and the surface of the interconnect layer 15 exposed inside the cavities 15x. Because the first seed layer 22a includes the protruding portion, it is possible to obtain an effect of preventing the interconnect layer 22 from becoming separated (or stripped off) from the insulating layer 21 due to poor adhesion.

The interconnect layer 22 is provided with cavities 22x that are recessed from the upper surface toward the lower surface of the interconnect layer 22, communicates with the via holes 23x, and extend to the outer peripheral side of the lower end of the inner side surface of the via holes 23x in the plan view. A depth of a deepest portion of the cavity 22x may be the same as that of the cavity 15x, for example. A length of a portion of the cavity 22x extending toward the outer peripheral side from the lower end of the inner surface of the via hole 23x in the plan view may be the same as that of the cavity 15x, for example.

A part or all of the insulating layer 23 forming the inner side surface of the via holes 23x in the plan view overlaps the outer peripheral portion of the cavities 22x. The insulating layer 23 does not enter inside the cavities 22x. The cavity 22x has a shape such that a central side thereof is the deepest, and the depth decreases toward the outer peripheral side, for example.

The via hole 23x may be a concave portion having the same shape as the via hole 21x, for example. Maximum widths of the first opening and the second opening of cavity forming the via hole 23x may be the same as those of the via hole 21x, for example. A depth and an aspect ratio of the via hole 23x may be the same as those of the via hole 21x, for example.

A surface roughness of the upper surface of the insulating layer 23 is smaller than a surface roughness of the inner side surface of the via holes 23x. The surface roughness of the upper surface of the insulating layer 23 may be the same as that of the insulating layer 21, for example. The surface roughness of the inner side surface of the via holes 23x may be the same as that of the inner side surface of the via holes 21x, for example.

The interconnect layer 24 includes a first seed layer 24a, a second seed layer 24b, and an electrolytic plating layer 24c. The first seed layer 24a is provided on the upper surface of the insulating layer 23. The first seed layer 24a is preferably formed of a material having good adhesion with respect to the insulating layer 23. A material used for the first seed layer 24a may be the same as that of the first seed layer 22a, for example. The first seed layer 24a can be formed by a dry process.

The second seed layer 24b continuously covers an upper surface and an inner side surface of the first seed layer 24a, the inner side surface of the via holes 23x, the surface of the insulating layer 23 exposed inside the cavities 22x, and the surface of the interconnect layer 22 exposed inside the cavities 22x. A material used for the second seed layer 24b may be the same as that of the second seed layer 22b, for example. The second seed layer 24b can be formed by a wet process. The first seed layer 24a is thinner than the second seed layer 24b. A thickness of the first seed layer 24a may be the same as that of the first seed layer 22a, for example. A thickness of the second seed layer 24b may be the same as that of the second seed layer 22b, for example.

The electrolytic plating layer 24c is provided on the second seed layer 24b inside the cavities 22x, inside the via holes 23x, and above the insulating layer 23. A portion of the electrolytic plating layer 24c located inside the cavities 22x may include portions opposing the lower surface of the insulating layer 23 through the second seed layer 24b. A material used for the electrolytic plating layer 24c may be the same as that of the electrolytic plating layer 22c, for example.

The first seed layer 24a may include a protruding portion that protrudes toward an inner peripheral side than an upper end of the inner side surface of the via hole 23x in the plan view. The protruding portion of the first seed layer 24a is provided in an annular shape in the plan view, for example. A length of the protruding portion of the first seed layer 24a protruding toward the inner peripheral side than the upper end of the inner side surface of the via hole 23x in the plan view may be the same as that of the first seed layer 22a, for example.

In a case where the first seed layer 24*a* includes the protruding portion, the second seed layer 24*b* continuously covers the upper surface and the inner side surface of the first seed layer 24*a*, a lower surface of the protruding portion of the first seed layer 24*a*, the inner side surface of the via holes 23*x*, the surface of the insulating layer 23 exposed inside the cavities 22*x*, and the surface of the interconnect layer 22 exposed inside the cavities 22*x*.

The interconnect layer 24 is provided with cavities 24*x* that are recessed from the upper surface toward the lower surface of the interconnect layer 24, communicates with the via holes 25*x*, and extend to the outer peripheral side of the lower end of the inner side surface of the via holes 25*x* in the plan view. A depth of a deepest portion of the cavity 24*x* may be the same as that of the cavity 15*x*, for example. A length of a portion of the cavity 24*x* extending toward the outer peripheral side from the lower end of the inner surface of the via hole 25*x* in the plan view may be the same as that of the cavity 15*x*, for example.

A part or all of the insulating layer 25 forming the inner side surface of the via holes 25*x* in the plan view overlaps the outer peripheral portion of the cavities 24*x*. The insulating layer 25 does not enter inside the cavities 24*x*. The cavity 24*x* has a shape such that a central side thereof is the deepest, and the depth decreases toward the outer peripheral side, for example.

The via hole 25*x* may be a concave portion having the same shape as the via hole 21*x*, for example. Maximum widths of the first opening and the second opening of cavity forming the via hole 25*x* may be the same as those of the via hole 21*x*, for example. A depth and an aspect ratio of the via hole 25*x* may be the same as those of the via hole 21*x*, for example.

A surface roughness of the upper surface of the insulating layer 25 is smaller than a surface roughness of the inner side surface of the via holes 25*x*. The surface roughness of the upper surface of the insulating layer 25 may be the same as that of the insulating layer 21, for example. The surface roughness of the inner side surface of the via holes 25*x* may be the same as that of the inner side surface of the via holes 21*x*, for example.

The interconnect layer 26 includes a first seed layer 26*a*, a second seed layer 26*b*, and an electrolytic plating layer 26*c*. The first seed layer 26*a* is provided on the upper surface of the insulating layer 25. The first seed layer 26*a* is preferably formed of a material having good adhesion with respect to the insulating layer 25. A material used for the first seed layer 26*a* may be the same as that of the first seed layer 22*a*, for example. The first seed layer 26*a* can be formed by a dry process.

The second seed layer 26*b* continuously covers an upper surface and an inner side surface of the first seed layer 26*a*, the inner side surface of the via holes 25*x*, the surface of the insulating layer 25 exposed inside the cavities 24*x*, and the surface of the interconnect layer 24 exposed inside the cavities 24*x*. A material used for the second seed layer 26*b* may be the same as that of the second seed layer 22*b*, for example. The second seed layer 26*b* can be formed by a wet process. The first seed layer 26*a* is thinner than the second seed layer 26*b*. A thickness of the first seed layer 26*a* may be the same as that of the first seed layer 22*a*, for example. A thickness of the second seed layer 26*b* may be the same as that of the second seed layer 22*b*, for example.

The electrolytic plating layer 26*c* is provided on the second seed layer 26*b* inside the cavities 24*x*, inside the via holes 25*x*, and above the insulating layer 25. A portion of the electrolytic plating layer 26*c* located inside the cavities 24*x* may include portions opposing the lower surface of the insulating layer 25 through the second seed layer 26*b*. A material used for the electrolytic plating layer 26*c* may be the same as that of the electrolytic plating layer 22*c*, for example.

The first seed layer 26*a* may include a protruding portion that protrudes toward an inner peripheral side than an upper end of the inner side surface of the via hole 25*x* in the plan view. The protruding portion of the first seed layer 26*a* is provided in an annular shape in the plan view, for example. A length of the protruding portion of the first seed layer 26*a* protruding toward the inner peripheral side than the upper end of the inner side surface of the via hole 25*x* in the plan view may be the same as that of the first seed layer 22*a*, for example.

In a case where the first seed layer 26*a* includes the protruding portion, the second seed layer 26*b* continuously covers the upper surface and the inner side surface of the first seed layer 26*a*, a lower surface of the protruding portion of the first seed layer 26*a*, the inner side surface of the via holes 25*x*, the surface of the insulating layer 25 exposed inside the cavities 24*x*, and the surface of the interconnect layer 24 exposed inside the cavities 24*x*.

Method For Manufacturing Wiring Board

Next, a method for manufacturing the wiring board according to the first embodiment will be described. FIG. 2A through FIG. 5B are diagrams illustrating examples of manufacturing processes of the wiring board according to the first embodiment.

The wiring board 5 illustrated in FIG. 1 may be manufactured by successively laminating interconnect layers and insulating layers on the one surface 10*a* and the other surface 10*b* of the core layer 10 by a well known build-up method, for example. In this example, the processes (or steps) of forming the interconnect layer 15, the insulating layer 21, the interconnect layer 22, the insulating layer 23, the interconnect layer 24, the insulating layer 25, the interconnect layer 26, and the metal layer 27 on the wiring board having the insulating layer 14 laminated thereon, will be described with reference to the region A.

First, in the process illustrated in FIG. 2A, the via hole 14*x* is formed in the insulating layer 14, and the interconnect layer 15 is thereafter formed on the insulating layer 14. For example, after the via hole 14*x* is formed, a resist layer having an opening that exposes a region where the interconnect layer 15 is to be formed is formed on the upper surface of the insulating layer 14. The resist layer can be formed by attaching a photosensitive dry film resist onto the insulating layer 14, for example. The opening can be formed by exposing and developing the photosensitive dry film resist, for example. The interconnect layer 15 may be formed inside the via hole 14*x* exposed inside the opening of the resist layer, and on the upper surface of the insulating layer 14, by a known semi-additive method, for example. After the interconnect layer 15 is formed, the resist layer is removed. The material used for the interconnect layer 15 and the thickness of the interconnect layer 15 are as described above.

Figure 2B:
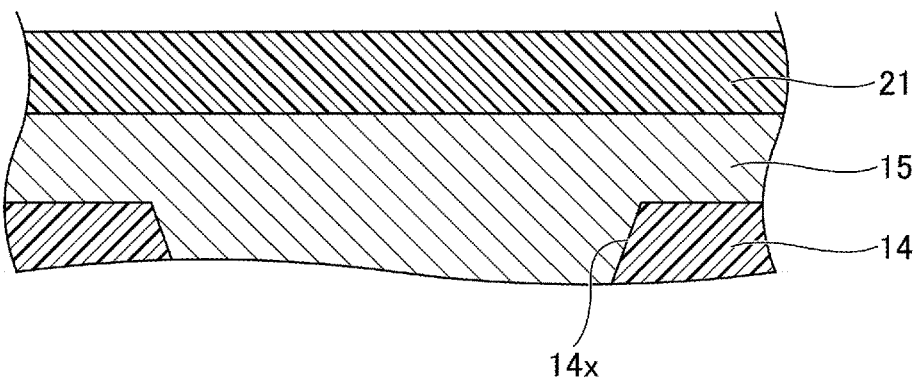

Next, in the process illustrated in FIG. 2B, an uncured insulating resin film that covers the upper surface and the side surface of the interconnect layer 15 is laminated on the insulating layer 14, and the insulating resin film is cured by being pressed toward the insulating layer 14 while being heated, for example, thereby forming the insulating layer 21. In this case, in order to reduce a skin effect, it is preferable to select an insulating resin film having a small surface roughness such that the surface roughness of the upper surface thereof is Ra30 nm or less. It is more preferable to select an insulating resin film having a small surface roughness of Ra20 nm or less, and even more preferable to select an insulating resin film having a small surface roughness of Ra10 nm or less. Instead of laminating the insulating resin film, the insulating layer 21 may be formed by coating a liquid or paste of the insulating resin and thereafter curing the liquid or paste of the insulating resin. In a case where the surface roughness of the upper surface of the insulating layer 21 is large, the upper surface of the insulating layer 21 is preferably planarized by chemical mechanical polishing (CMP) or the like to reduce the skin effect, so that the surface roughness of the upper surface of the insulating layer 21 falls within the preferable range described above. The material used for the insulating layer 21 and the thickness of the insulating layer 21 are as described above.

Figure 2C:
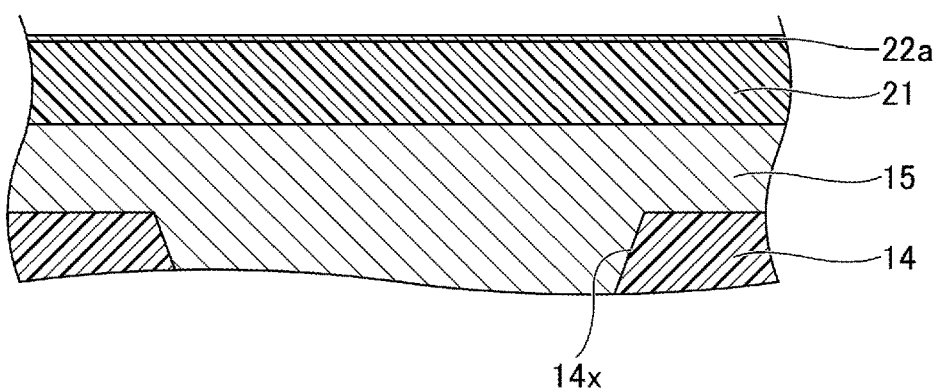

Next, in the process illustrated in FIG. 2C, the first seed layer 22a is formed on the upper surface of the insulating layer 21 by a dry process. Examples of the dry process include sputtering, vapor deposition, ion plating, or the like, for example. The material used for the first seed layer 22a and thickness of the first seed layer 22a are as described above.

Figure 3A:
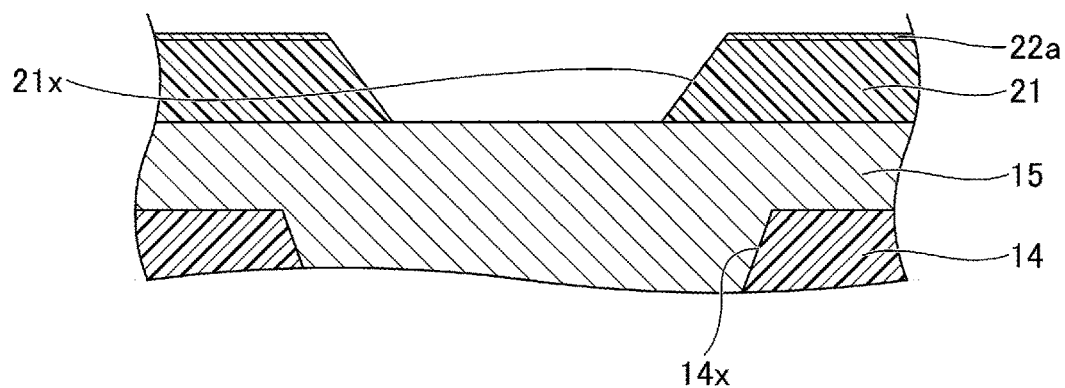
FIG. 3A, FIG. 3B, and FIG. 3C are diagrams (part 2) illustrating examples of the manufacturing processes of the wiring board according to the first embodiment.

Next, in the process illustrated in FIG. 3A, the via holes 21x are formed in the first seed layer 22a and the insulating layer 21, penetrating the first seed layer 22a and the insulating layer 21 and reaching the upper surface of the interconnect layer 15. The via hole 21x can be formed by a laser beam machining using a $CO_2$ laser or the like, for example. The via hole 21x may be a cavity having an inverted truncated cone shape in the cross sectional view, and a maximum width of a first opening of the cavity at one end which opens toward the first seed layer 22a is greater than a maximum width of a second opening of the cavity at the other end reaching the upper surface of the interconnect layer 15.

Figure 3B:
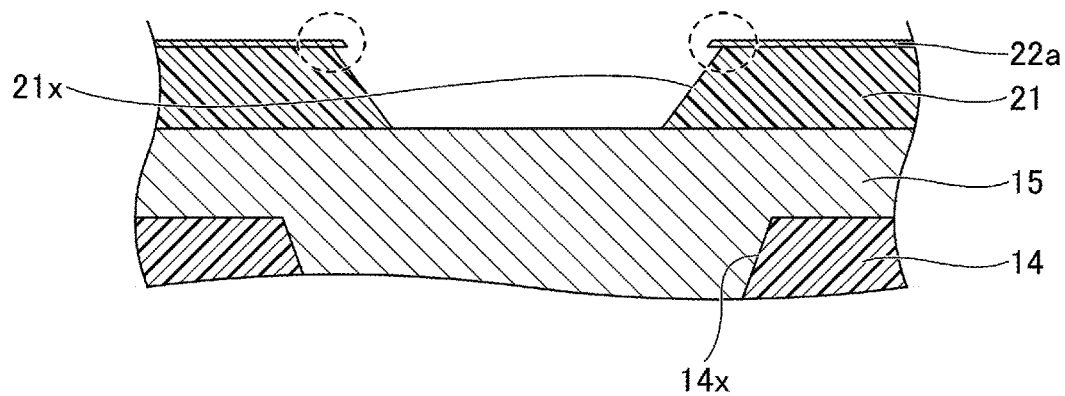

Next, in the process illustrated in FIG. 3B, a desmear process is performed on the insulating layer 21. Hence, it is possible to remove a resin residue of the insulating layer 21 adhered on the upper surface of the interconnect layer 15 exposed at the bottom of the via hole 21x. During the desmear process, the inner side surface of the insulating layer 21 is scraped and roughened. Because the upper surface of the insulating layer 21 covered with the first seed layer 22a is not roughened, the surface roughness of the inner side surface of the via hole 21x becomes larger than the surface roughness of the upper surface of the insulating layer 21 due to the desmear process. The surface roughness of the inner side surface of the via hole 21x may be greater than or equal to Ra100 nm and less than or equal to Ra200 nm, for example. Further, the inner side surface of the insulating layer 21 may be scraped by the desmear process, and the protruding portion protruding into the via hole 21x may be formed on the first seed layer 22a. In FIG. 3B, the protruding portion of the first seed layer 22a is formed inside a circle indicated by a broken line. The desmear process is performed using an etchant that does not etch the interconnect layer 15. For example, in a case where the interconnect layer 15 is formed of copper, an etchant such as sodium permanganate, potassium permanganate, or the like can be used.

After the process illustrated in FIG. 3B, a foreign matter cleaning process to remove foreign matter generated by the desmear process may be provided. The foreign matter cleaning process can be performed using a surfactant, for example. By using the surfactant, it is also possible to obtain an effect of improving wettability inside the via hole, in addition to the foreign matter cleaning. A part of the surfactant may adhere on the upper surface of the interconnect layer 15.

Figure 3C:
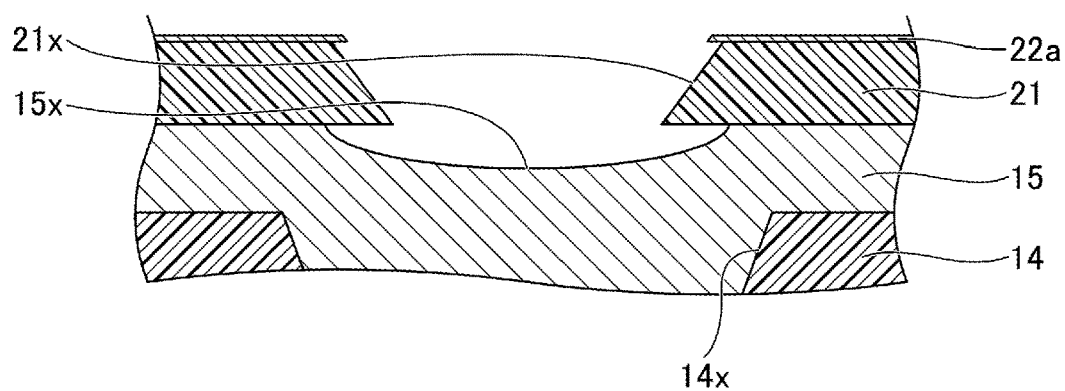

Next, in the process illustrated in FIG. 3C, the cavity 15x is formed in the interconnect layer 15. The cavity 15x is formed so as to be recessed from the upper surface toward the lower surface of the interconnect layer 15, communicate with the via hole 21x, and extend to the outer peripheral side than the lower end of the inner side surface of the via hole 21x in the plan view. The cavity 15x can be formed by wet etching using an etchant that can etch the interconnect layer 15 but does not etch the first seed layer 22a, for example. For example, in the case where the interconnect layer 15 is formed of copper and the first seed layer 22a is formed of titanium, a mixed aqueous solution of sulfuric acid and hydrogen peroxide, a sodium persulfate aqueous solution, an ammonium persulfate aqueous solution, or the like may be used as the etchant. In a case where a part of the surfactant adheres on the upper surface of the interconnect layer 15 in during the foreign matter cleaning process, this part of the surfactant is removed when forming the cavity 15x.

Figure 4A:
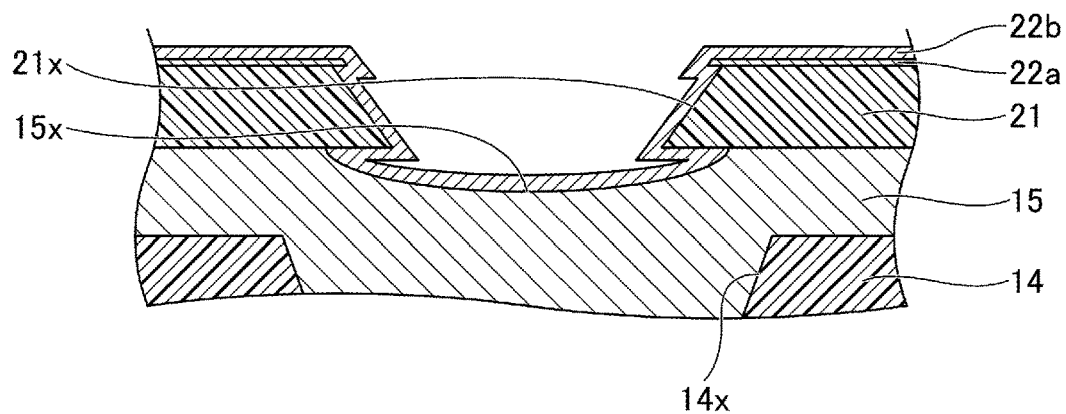
FIG. 4A, FIG. 4B, and FIG. 4C are diagrams (part 3) illustrating examples of the manufacturing processes of the wiring board according to the first embodiment.

Next, in the process illustrated in FIG. 4A, the second seed layer 22b is formed by a wet process. Before the second seed layer 22b is formed, a catalyst, such as Pd or the like, is preferably provided on the surface at the portions where the second seed layer 22b is to be formed. The second seed layer 22b is formed so as to continuously cover the upper surface and the inner side surface of the first seed layer 22a, the lower surface of the protruding portion of the first seed layer 22a, the inner side surface of the via hole 21x, the surface of the insulating layer 21 exposed inside the cavity 15x, and the surface of the interconnect layer 15 exposed inside the cavity 15x, as described above. The material used for the second seed layer 22b and the thickness of the second seed layer 22b are as described above. In a case where the protruding portion is not formed on the first seed layer 22a in the process illustrated in FIG. 3B, the second seed layer 22b is formed to continuously cover the upper surface and the inner side surface of the first seed layer 22a, the inner side surface of the via hole 21x, the surface of the insulating layer 21 exposed inside the cavity 15x, and the surface of the interconnect layer 15 exposed inside the cavity 15x. Because the surface roughness of the inner side surface of the via hole 21x is increased by the desmear process, a good adhesion due to an anchor effect is obtained between the inner side surface of the via hole 21x and the second seed layer 22b.

Figure 4B:
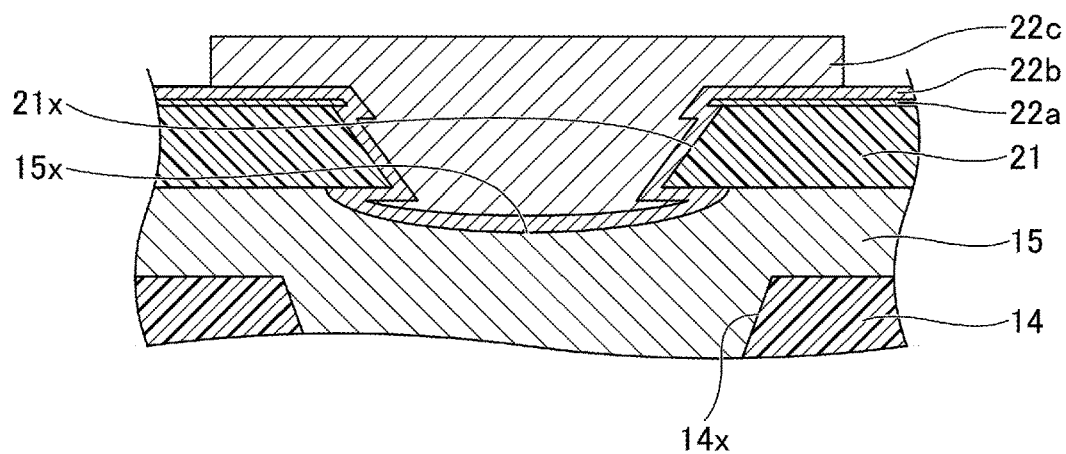
Figure 4C:
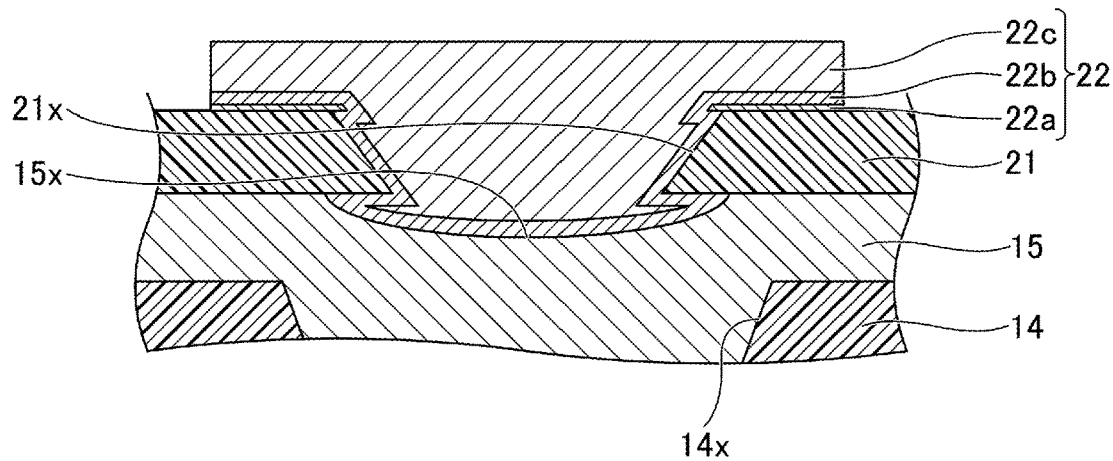

Next, in the processes illustrated in FIG. 4B and FIG. 4C, the interconnect layer 22 is formed. First, in the process illustrated in FIG. 4B, a resist layer having an opening that exposes a region where the interconnect layer 22 is to be formed is formed on the upper surface of the second seed layer 22b. The resist layer can be formed by attaching a photosensitive dry film resist onto the second seed layer 22b, for example. The opening can be formed by exposing and developing the photosensitive dry film resist, for example. Then, electrolytic plating is performed using the second seed layer 22b as a power supply layer, and the electrolytic plating layer 22c is formed inside the opening of the resist layer. Thereafter, the resist layer is removed.

Next, in the process illustrated in FIG. 4C, etching is performed using the electrolytic plating layer 22c as a mask, to remove the first seed layer 22a and the second seed layer 22b that are exposed from the electrolytic plating layer 22c. Hence, the interconnect layer 22 is formed to include the first seed layer 22a, the second seed layer 22b, and the electrolytic plating layer 22c, and filling the via hole 21x and extending on the upper surface of the insulating layer 21. The first seed layer 22a and the second seed layer 22b may be removed by using different etchants. For example, in the case where the second seed layer 22b is formed of copper, the etchant described above can be used. For example, in a case where the first seed layer 22a is formed of titanium (Ti), an etchant, such as a mixed aqueous solution of potassium hydrate and peroxide or the like, may be used. The first seed layer 22a may be removed by dry etching.

Figure 5A:
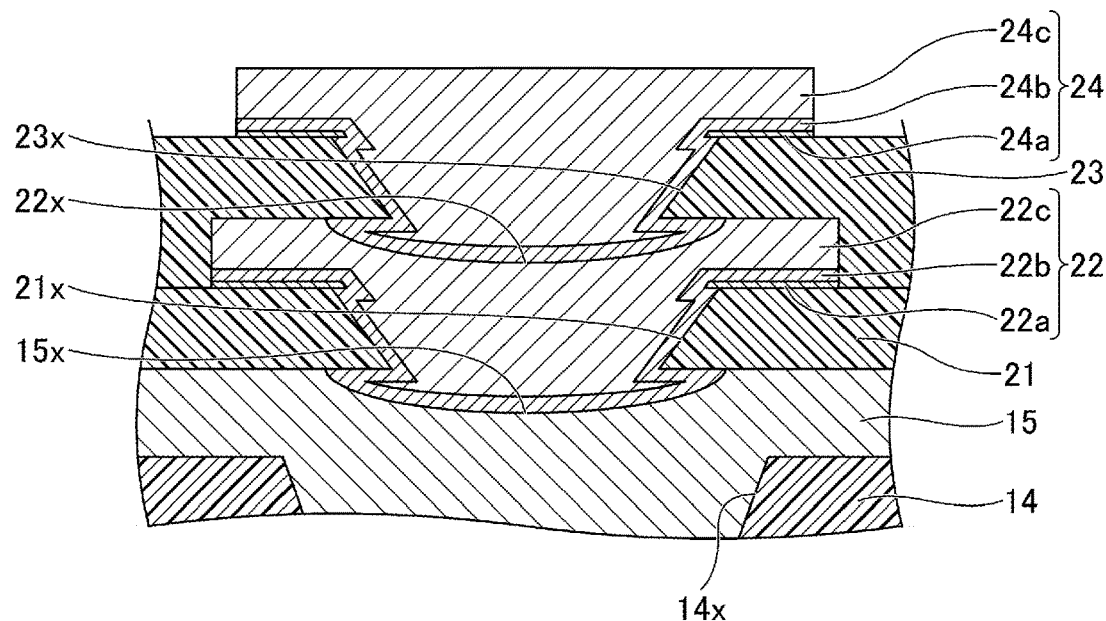
FIG. 5A and FIG. 5B are diagrams (part 4) illustrating examples of the manufacturing processes of the wiring board according to the first embodiment.

Next, in the process illustrated in FIG. 5A, processes similar to the processes illustrated in FIG. 2B through FIG. 4C are repeated to successively form the insulating layer 23, the first seed layer 24a, the via hole 23x, the cavity 22x, the second seed layer 24b, and the electrolytic plating layer 24c, and to provide the interconnect layer 24 on the insulating layer 23.

Figure 5B:
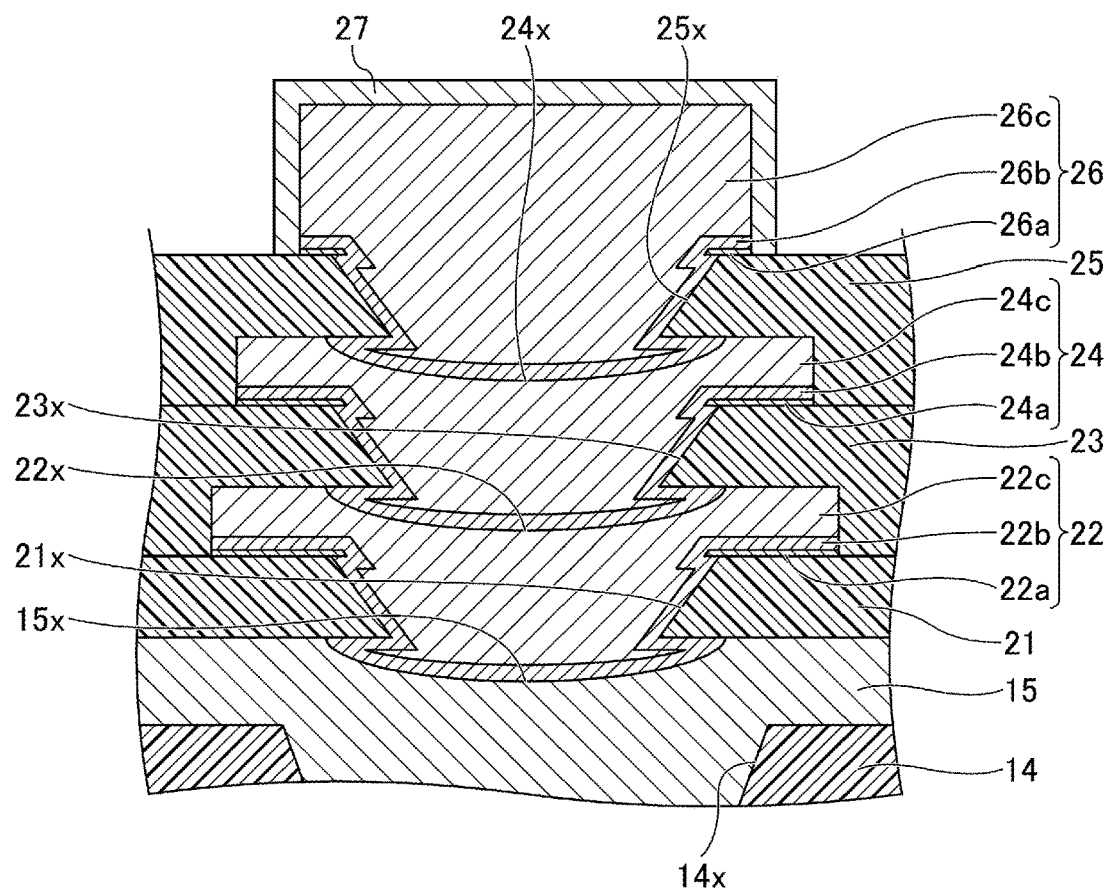

Next, in the process illustrated in FIG. 5B, processes similar to the processes illustrated in FIG. 2B through FIG. 4C are repeated to successively form the insulating layer 25, the first seed layer 26a, the via hole 25x, the cavity 24x, the second seed layer 26b, and the electrolytic plating layer 26c, and to provide the interconnect layer 26 on the insulating layer 25. Then, the metal layer 27 is formed on the upper surface and the side surface of the electrode of the interconnect layer 26 protruding from the upper surface of the insulating layer 25 by electroless plating or the like. The material used for the metal layer 27 and the thickness of the metal layer 27 are as described above.

As described above, in the manufacturing processes of the wiring board 5, the first seed layer is formed on the upper surface of the insulating layer by the dry process, the via hole is formed thereafter, and the second seed layer is formed inside the via hole and on the first seed layer by the wet process. By forming the second seed layer by the wet process, the possibility of the seed layer not being deposited inside the via hole can be reduced. Accordingly, a reliability of connection between the interconnect layers through the via interconnects can be improved. In particular, in the case of a small and deep via hole having a first opening with a maximum width of 10 μm or less and an aspect ratio that is 1 or greater, the seed layer is likely not deposited satisfactorily inside the via hole according to the conventional dry process. For this reason, the method for manufacturing the wiring board 5 in which the seed layer is formed inside the via hole by the wet process is extremely effective and useful.

In addition, according to the manufacturing processes of the wiring board 5, even when the desmear process or the like is performed as a pretreatment for the formation of the second seed layer by the wet process, the upper surface of the insulating layer will not be roughened because the upper surface of the insulating layer is covered with the first seed layer. For this reason, it is possible to reduce an increase in the surface roughness of the upper surface of the insulating layer, and to reduce the skin effect, thereby enabling excellent high-frequency transmission characteristics to be obtained.

Instead of forming the first seed layer by the dry process, it is conceivable to use an insulating layer with a copper foil formed thereon. In this case, in the case where the desmear process or the like is performed as a pretreatment for the formation of the second seed layer by a wet process, the upper surface of the insulating layer will not be roughened because the upper surface of the insulating layer is covered with the copper foil. However, in this case, the surface roughness of the upper surface of the insulating layer is determined by the surface roughness of the copper foil surface. Generally, the surface roughness of the copper foil surface is approximately Ra200 nm, and thus, it is difficult to reduce the skin effect according to this method using the insulating layer covered with the copper foil. That is, in order to reduce the skin effect, it is necessary to form the first seed layer by a dry process.

Figure 6:
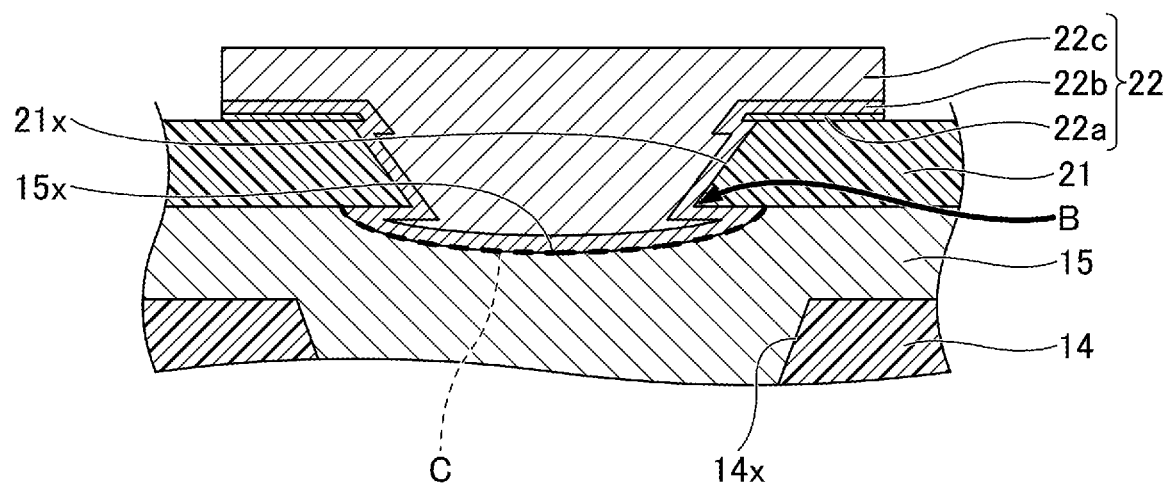
FIG. 6 is a diagram for explaining one effect of the wiring board according to the first embodiment.

In addition, according to the wiring board 5, it is possible to obtain an effect of reducing a break at an interface between the interconnect layer and the second seed layer caused by concentration of stress. This effect will be described with reference to FIG. 6. In FIG. 6, B denotes the insulating layer 21 that forms the lower end of the inner side surface of the via hole 21x. Further, C denotes an interface between the interconnect layer 15 and the second seed layer 22b. The lower end B of the inner side surface of the via hole 21x is a point where the stress is concentrated due to thermal shrinkage of the insulating layer 21 caused by heating and cooling when a semiconductor chip is mounted on the wiring board 5, for example. For this reason, if the cavity 15x were not formed, a distance between the lower end B and the interface C would become short, and a break may easily occur at the interface C between the interconnect layer 15 and the second seed layer 22b due to the concentration of stress. However, according to the wiring board 5, the distance between the lower end B and the interface C is long because the cavity 15x is formed. Accordingly, it is possible to reduce the break at the interface C between the interconnect layer 15 and the second seed layer 22b, which may otherwise occur due to the concentration of stress, and to improve the connection reliability between the interconnect layer 15 and the interconnect layer 22. Similar effects can be obtained for the other interconnect layers having the cavity.

Application Example of First Embodiment

In an application example of the first embodiment, an example of a semiconductor device including a semiconductor chip mounted on a wiring board, will be described. In the application example of the first embodiment, a description of the parts that are the same as those corresponding parts of the above described embodiment may be omitted.

FIG. 7 is a cross sectional view illustrating an example of the semiconductor device according to the application example of the first embodiment. As illustrated in FIG. 7, a semiconductor device 7 includes the wiring board 5 illustrated in FIG. 1A and FIG. 1B, semiconductor chips 110A and 110B, electrode posts 120, and solder 130.

Each of the semiconductor chips 110A and 110B includes a thinned semiconductor substrate (not illustrated) made of silicon or the like, and a semiconductor integrated circuit (not illustrated) formed on the semiconductor substrate, for example. The electrode posts 120 electrically connected to the semiconductor integrated circuit are formed on the semiconductor substrate. The electrode posts 120 are connection terminals connected to the wiring board 5, and are copper posts, for example. The semiconductor chip 110A may be a processor, such as a central processing unit (CPU), a graphics processing unit (GPU), or the like, for example. The semiconductor chip 110B may be a memory, such as a high bandwidth memory (HBM) or the like, for example.

The electrode posts 120 are electrically connected to the interconnect layer 26 and the metal layer 27 of the wiring board 5 through the solder 130. A material used for the solder 130 may be an alloy including lead (Pb), an alloy of tin (Sn) and copper (Cu), an alloy of Sn and silver (Ag), an alloy of Sn, Ag, and Cu, or the like, for example. An underfill resin (not illustrated) may be filled into a space between the upper surface of the wiring board 5 and the semiconductor chips 110A and 110B.

As described above, the semiconductor device 7 can be obtained by mounting the semiconductor chips 110A and 110B on the wiring board 5 according to the first embodiment. As described above, the wiring board 5 is a high-density wiring board having a high-density micro interconnect layer and via holes having the first opening with a small maximum width, and can achieve excellent high-frequency transmission characteristics with reduced skin effect. For this reason, the wiring board 5 can be suitably used as an interposer board for high-speed data communication between a processor and a memory, for example.

According to the disclosed technique, it is possible to provide a wiring board which does not prevent a seed layer from being deposited inside the via hole, and prevents a surface roughness of an upper surface of an insulating layer from increasing.

Various aspects of the subject-matter described herein may be set out non-exhaustively in the following numbered clauses:

1. A method for manufacturing a wiring board, comprising:
   forming an insulating layer covering an upper surface and a side surface of a first interconnect layer;
   forming a first seed layer on an upper surface of the insulating layer by a dry process;
   forming a via hole penetrating the first seed layer and the insulating layer and reaching an upper surface of the first interconnect layer;
   forming a cavity in the first interconnect layer, the cavity being recessed from the upper surface toward a lower surface of the first interconnect layer, communicating with the via hole, and extending to an outer peripheral side than a lower end of an inner side surface of the via hole in a plan view;
   forming a second seed layer by a wet process, the second seed layer continuously covering an upper surface and an inner side surface of the first seed layer, the inner side surface of the via hole, a surface of the insulating layer exposed inside the cavity, and a surface of the first interconnect layer exposed inside the cavity; and
   forming a second interconnect layer by electrolytic plating using the second seed layer as a power supply layer, the second interconnect layer including the first seed layer, the second seed layer, and an electrolytic plating layer, and filling the via hole and extending on the upper surface of the insulating layer,
   wherein the first seed layer is thinner than the second seed layer.

2. The method for manufacturing the wiring board according to clause 1, further comprising:
   performing a desmear process after forming the via hole and before forming the cavity,
   wherein a surface roughness of the inner side surface of the via hole becomes greater than a surface roughness of the upper surface of the insulating layer by the desmear process.

3. The method for manufacturing the wiring board according to clause 2, wherein
   a protruding portion protruding into the via hole is formed in the first seed layer by the desmear process, and
   the second seed layer continuously covers the upper surface and the inner side surface of the first seed layer, a lower surface of the protruding portion, the inner side surface of the via hole, the surface of the insulating layer exposed inside the cavity, and the surface of the first interconnect layer exposed inside the cavity.

4. The method for manufacturing the wiring board according to clause 2 or 3, wherein the cavity is formed by wet etching.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, the present invention can also be applied to a wiring board having a structure different from the structure illustrated in FIG. 1A and FIG. 1B. An examples of the wiring board to which the present invention can be applied includes a coreless wiring board which does not include a core layer or a third interconnect structure, and a second interconnect structure is laminated on a first interconnect structure.

What is claimed is:

1. A wiring board comprising:
   a first interconnect layer;
   an insulating layer covering an upper surface and a side surface of the first interconnect layer;
   a via hole penetrating the insulating layer and reaching an upper surface of the first interconnect layer;
   a second interconnect layer filling the via hole and extending on an upper surface of the insulating layer; and
   a cavity provided in the first interconnect layer, recessed from the upper surface of the first interconnect layer toward a lower surface of the first interconnect layer and communicating with the via hole, and extending horizontally to a position on an outer peripheral side than a position of a lower end of an inner side surface of the via hole in a plan view, wherein;
   the second interconnect layer includes:
   a first seed layer provided on the upper surface of the insulating layer;
   a second seed layer continuously covering an upper surface and an inner side surface of the first seed layer, the inner side surface of the via hole, a surface of the insulating layer exposed inside the cavity, and a surface of the first interconnect layer exposed inside the cavity; and
   an electrolytic plating layer provided on the second seed layer, and the first seed layer is thinner than the second seed layer.

2. The wiring board as claimed in claim 1, wherein the upper surface of the insulating layer has a surface roughness smaller than a surface roughness of the inner side surface of the via hole.

3. The wiring board as claimed in claim 1, wherein a portion of the electrolytic plating layer located inside the cavity includes a portion opposing a lower surface of the insulating layer through the second seed layer.

4. The wiring board as claimed in claim 1, wherein the cavity is shaped to become shallower toward an outer peripheral side.

5. The wiring board as claimed in claim 1, wherein the via hole has an opening with a maximum width of 10 µm or less at one end opening toward the first seed layer, and
   the via hole has an aspect ratio of 1 or greater.

6. A wiring board comprising:
a first interconnect layer;
an insulating layer covering an upper surface and a side surface of the first interconnect layer;
a via hole penetrating the insulating layer and reaching an upper surface of the first interconnect layer;
a second interconnect layer filling the via hole and extending on an upper surface of the insulating layer; and
a cavity provided in the first interconnect layer, recessed from the upper surface toward a lower surface of the first interconnect layer and communicating with the via hole, and extending to an outer peripheral side than a lower end of an inner side surface of the via hole in a plan view, wherein:
the second interconnect layer includes:
- a first seed layer provided on the upper surface of the insulating layer;
- a second seed layer continuously covering an upper surface and an inner side surface of the first seed layer, the inner side surface of the via hole, a surface of the insulating layer exposed inside the cavity, and a surface of the first interconnect layer exposed inside the cavity; and
- an electrolytic plating layer provided on the second seed layer, the first seed layer is thinner than the second seed layer,
the first seed layer includes a protruding portion protruding toward an inner peripheral side than an upper end of the inner side surface of the via hole in the plan view, and
the second seed layer continuously covers the upper surface and the inner side surface of the first seed layer, a lower surface of the protruding portion, the inner side surface of the via hole, the surface of the insulating layer exposed inside the cavity, and the surface of the first interconnect layer exposed inside the cavity.

7. The wiring board as claimed in claim 6, wherein the upper surface of the insulating layer has a surface roughness smaller than a surface roughness of the inner side surface of the via hole.

8. The wiring board as claimed in claim 6, wherein a portion of the electrolytic plating layer located inside the cavity includes a portion opposing a lower surface of the insulating layer through the second seed layer.

9. The wiring board as claimed in claim 6, wherein the cavity is shaped to become shallower toward an outer peripheral side.

10. The wiring board as claimed in claim 6, wherein the via hole has an opening with a maximum width of 10 μm or less at one end opening toward the first seed layer, and
the via hole has an aspect ratio of 1 or greater.

* * * * *